(12) United States Patent
Myung et al.

(10) Patent No.: US 9,281,257 B2
(45) Date of Patent: Mar. 8, 2016

(54) SEMICONDUCTOR PACKAGE INCLUDING A CONNECTING MEMBER

(71) Applicant: SAMSUNG ELECTRO-MECHANICS CO., LTD., Suwon (KR)

(72) Inventors: Jun Woo Myung, Suwon (KR); Sung Min Song, Suwon (KR)

(73) Assignee: SAMSUNG ELECTRO-MECHANICS CO., LTD., Suwon (KR)

( * ) Notice: Subject to any disclaimer, the term of this patent is extended or adjusted under 35 U.S.C. 154(b) by 0 days.

(21) Appl. No.: 14/501,577

(22) Filed: Sep. 30, 2014

(65) Prior Publication Data
US 2015/0187684 A1    Jul. 2, 2015

(30) Foreign Application Priority Data

Dec. 26, 2013  (KR) .......................... 10-2013-0163959

(51) Int. Cl.
*H01L 23/31* (2006.01)
*H01L 23/495* (2006.01)
*H01L 23/00* (2006.01)

(52) U.S. Cl.
CPC ........ *H01L 23/3107* (2013.01); *H01L 23/4952* (2013.01); *H01L 23/49517* (2013.01); *H01L 23/49524* (2013.01); *H01L 23/49562* (2013.01); *H01L 23/49575* (2013.01); *H01L 24/13* (2013.01); *H01L 24/16* (2013.01); *H01L 24/29* (2013.01); *H01L 24/32* (2013.01); *H01L 24/45* (2013.01); *H01L 24/48* (2013.01); *H01L 24/49* (2013.01); *H01L 24/73* (2013.01); *H01L 2224/131* (2013.01); *H01L 2224/16245* (2013.01); *H01L 2224/291* (2013.01); *H01L 2224/292* (2013.01); *H01L 2224/293* (2013.01); *H01L 2224/2919* (2013.01); *H01L 2224/2929* (2013.01); *H01L 2224/2939* (2013.01); (Continued)

(58) Field of Classification Search
CPC ... H01L 23/54; H01L 2224/451; H01L 24/48; H01L 24/49; H01L 23/49541; H01L 23/49575; H01L 24/05; H01L 24/06; H01L 2224/04042; H01L 2224/05599; H01L 2224/45124
USPC ......... 257/666, 667, 668, 696, 691, 692, 693, 257/670
See application file for complete search history.

(56) References Cited

U.S. PATENT DOCUMENTS 5,250,839 A * 10/1993 Katoh et al. .................. 257/666
6,040,623 A *  3/2000 Chan et al. .................... 257/692
(Continued)

FOREIGN PATENT DOCUMENTS

JP       2008-147604      6/2008
KR      10-2010-012628    2/2010

*Primary Examiner* — Alexander Oscar Williams

(57) ABSTRACT

The semiconductor package according to an exemplary embodiment in the present disclosure includes: at least one electronic device; a lead frame including a plurality of leads electrically connected to the electronic device; a lead connecting member coupled to at least one of the leads; and a molded portion sealing the electronic device and the lead connecting member.

12 Claims, 6 Drawing Sheets

(52) U.S. Cl.
CPC ............... *H01L 2224/32245* (2013.01); *H01L 2224/45124* (2013.01); *H01L 2224/45144* (2013.01); *H01L 2224/48091* (2013.01); *H01L 2224/48096* (2013.01); *H01L 2224/48111* (2013.01); *H01L 2224/48137* (2013.01); *H01L 2224/48139* (2013.01); *H01L 2224/48195* (2013.01); *H01L2224/48247* (2013.01); *H01L 2224/4903* (2013.01); *H01L 2224/49111* (2013.01); *H01L 2224/49171* (2013.01); *H01L 2224/49175* (2013.01); *H01L 2224/73265* (2013.01); *H01L 2924/1203* (2013.01); *H01L 2924/1305* (2013.01); *H01L 2924/13055* (2013.01); *H01L 2924/13091* (2013.01); *H01L 2924/1815* (2013.01); *H01L 2924/18301* (2013.01); *H01L 2924/19041* (2013.01); *H01L 2924/19042* (2013.01); *H01L 2924/19043* (2013.01); *H01L 2924/19105* (2013.01); *H01L 2924/19107* (2013.01)

(56) References Cited

U.S. PATENT DOCUMENTS

| | | | | |
|---|---|---|---|---|
| 6,066,890 | A * | 5/2000 | Tsui et al. | 257/723 |
| 6,093,957 | A * | 7/2000 | Kwon | 257/666 |
| 6,538,336 | B1 * | 3/2003 | Secker et al. | 257/786 |
| 6,794,738 | B2 * | 9/2004 | Mahle | 257/673 |
| 7,115,978 | B2 * | 10/2006 | Sun et al. | 257/676 |
| 8,008,132 | B2 * | 8/2011 | Upadhyayula et al. | 438/123 |
| 2001/0045627 | A1 * | 11/2001 | Connah et al. | 257/666 |
| 2002/0171128 | A1 * | 11/2002 | Yamanaka et al. | 257/666 |
| 2005/0173783 | A1 * | 8/2005 | Chow et al. | 257/666 |
| 2006/0102995 | A1 * | 5/2006 | Tsai et al. | 257/686 |
| 2007/0284703 | A1 * | 12/2007 | Wu et al. | 257/666 |
| 2008/0067640 | A1 * | 3/2008 | Do et al. | 257/666 |
| 2008/0135991 | A1 | 6/2008 | Harnden et al. | |
| 2010/0052120 | A1 * | 3/2010 | Pruitt | 257/666 |
| 2010/0314728 | A1 * | 12/2010 | Li | 257/666 |

\* cited by examiner

SEMICONDUCTOR PACKAGE INCLUDING A CONNECTING MEMBER

CROSS-REFERENCE TO RELATED APPLICATION

This application claims the benefit of Korean Patent Application No. 10-2013-0163959 filed on Dec. 26, 2013, with the Korean Intellectual Property Office, the disclosure of which is incorporated herein by reference.

BACKGROUND

The present disclosure relates to a semiconductor package, and more particularly, to a semiconductor package capable of preventing a lead frame from being separated from a molded portion during a manufacturing process.

In accordance with the development of the power electronics industry, using power devices such as power transistors, insulated-gate bipolar transistors (IGBTs), metal oxide semiconductor (MOS) transistors, silicon-controlled rectifiers (SCR), power rectifiers, servo drivers, power regulators, inverters, or converters, the demand for power products having excellent performance and capable of being lightened and miniaturized has increased.

In accordance with the above-mentioned trend, research into a technology of integrating various power devices in a single package and attempting to manufacture the power devices and a control device for controlling the power devices in the single package has package has recently been actively undertaken.

A power semiconductor package according to the related art is configured to generally include a lead frame, a power device mounted on the lead frame, and a molded portion forming exteriors of respective devices using a resin, or the like. In addition, the power semiconductor package includes a heat dissipating substrate to effectively discharge heat.

However, in the semiconductor package according to the related art, since the lead frame is not firmly fastened to the molded portion, it may be easily separated from the molded portion when external force is applied to the semiconductor package.

Therefore, a semiconductor package capable of more firmly fastening the lead frame to the molded portion and a manufacturing method thereof are required.

RELATED ART DOCUMENT (Patent Document 1) Korean Patent Laid-open Publication No. 2010-0012628

SUMMARY

An aspect of the present disclosure may provide a semiconductor package capable of firmly fastening a lead frame to a molded portion.

An aspect of the present disclosure may also provide a semiconductor package including a connecting member capable of electrically connecting lead frames to each other.

According to an aspect of the present disclosure, a semiconductor package may include: at least one electronic device; a lead frame including a plurality of leads electrically connected to the electronic device; a lead connecting member coupled to at least one of the leads; and a molded portion sealing the electronic device and the lead connecting member.

The lead connecting member may be formed to have a ⊏ shape.

The lead connecting member may include: a plurality of coupling parts coupled to the leads; and a connecting part connecting the plurality of coupling parts to each other.

The coupling part of the lead connecting member may include: an insertion part inserted into a through hole formed in the lead; and an extension part disposed outside the through hole and having cross sectional area larger than that of the insertion part.

One lead connecting member may be coupled to one lead among the plurality of leads.

The lead connecting member may be coupled to the plurality of leads.

The lead connecting member may be formed of a conductive metal material.

The lead may include at least one through hole to which the lead connecting member is coupled.

The through hole may be formed to have a cylindrical shape.

The through hole may be formed to have a slit shape.

The lead frame may include an internal lead disposed in the molded portion and an external lead disposed outside the molded portion, and the lead connecting member may be coupled to the internal lead.

According to another aspect of the present disclosure, a semiconductor package may include: a lead frame including a plurality of leads electrically connected to an electronic device; a lead connecting member coupled to at least one of the leads to form a protrusion of the lead; and a molded portion sealing the electronic device and the lead connecting member.

According to another aspect of the present disclosure, a semiconductor package may include: a lead frame including a plurality of leads electrically connected to an electronic device; a lead connecting member coupled to the plurality of leads to electrically connect the leads to each other; and a molded portion sealing the electronic device and the lead connecting member.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
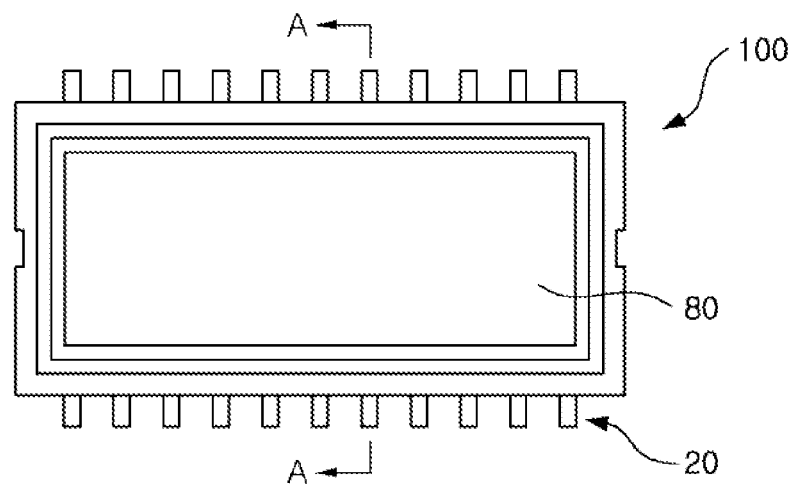
FIG. 1 is a plan view schematically illustrating a semiconductor package according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like.

Figure 2:
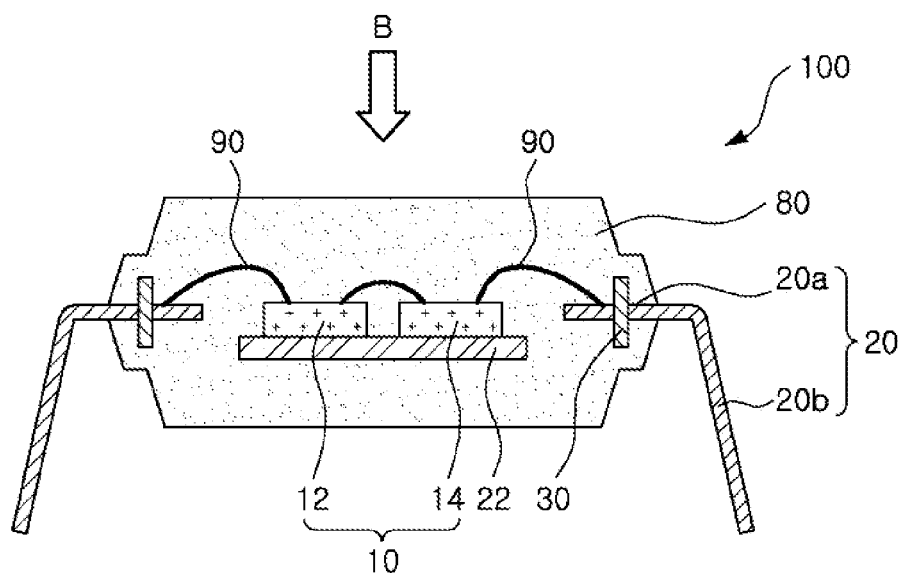
FIG. 2 is a cross-sectional view taken along the line A-A of FIG. 1.
Figure 3:
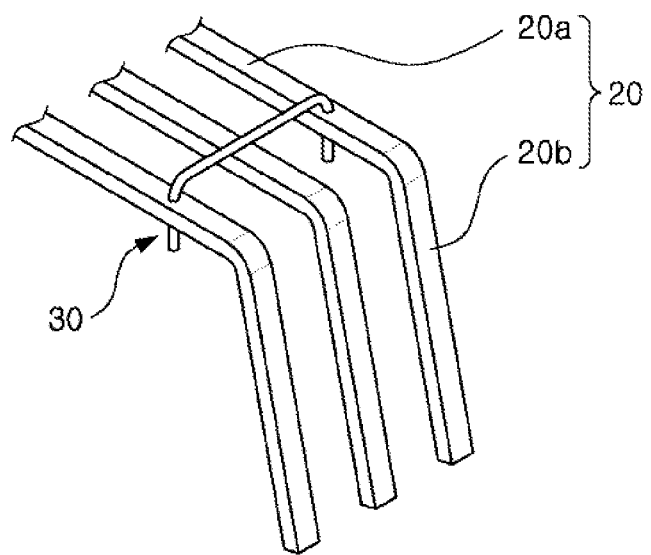
FIG. 3 is a perspective view schematically illustrating an internal lead and a lead connecting member of FIG. 2.
Figure 4:
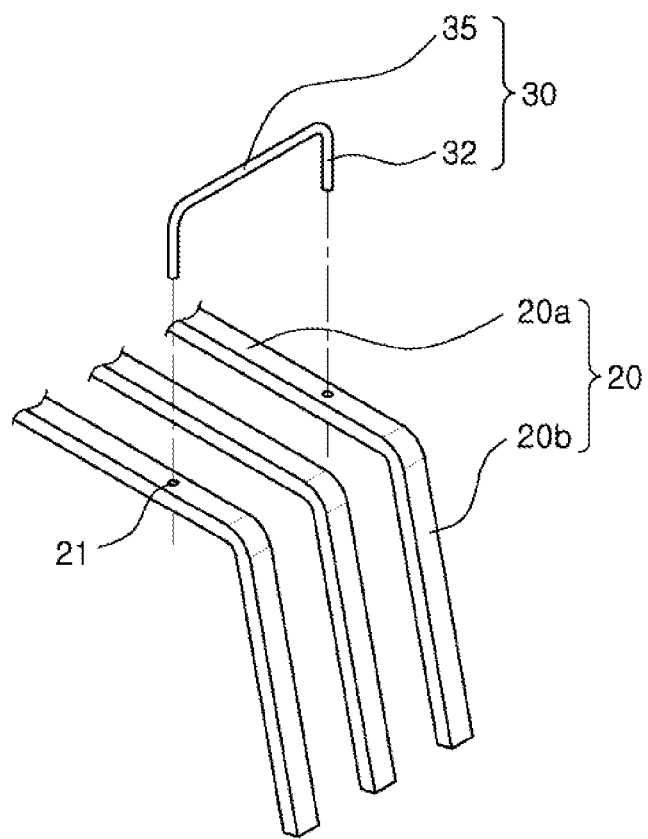
FIG. 4 is an exploded perspective view of FIG. 3.
Figure 5:
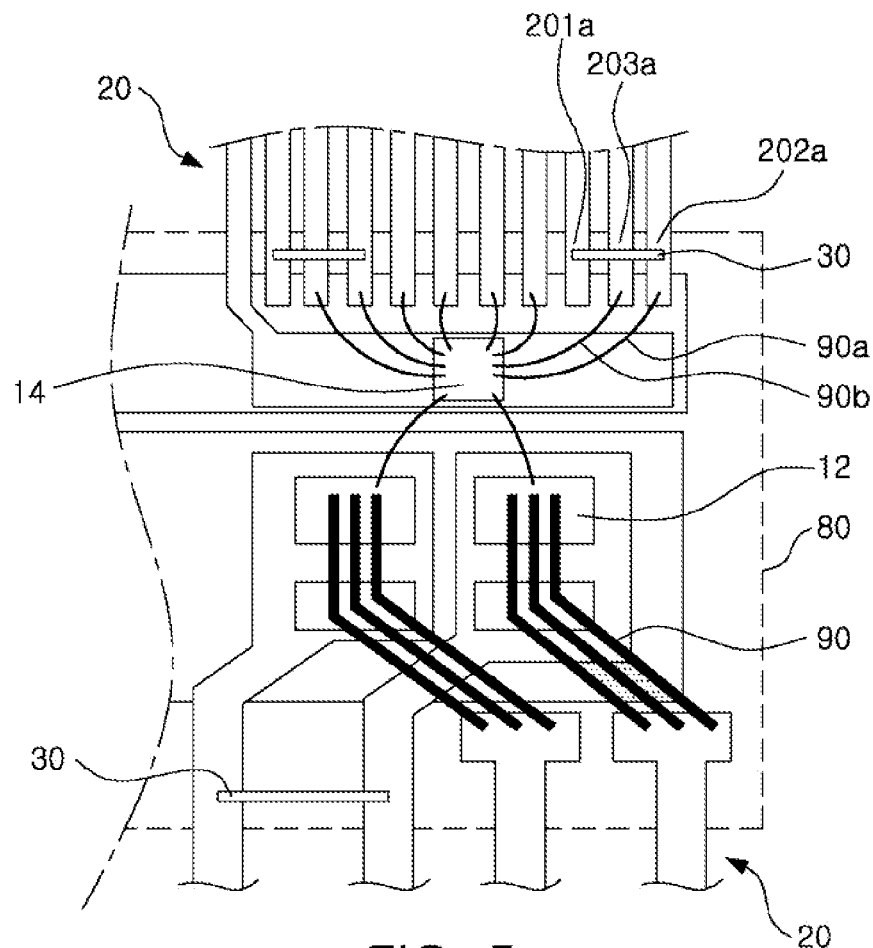
FIG. 5 is a partial plan view taken along a direction B of FIG. 2.

FIG. 1 is a plan view schematically illustrating a semiconductor package according to an exemplary embodiment in the present disclosure, FIG. 2 is a cross-sectional view taken along the line A-A of FIG. 1, and FIG. 3 is a perspective view schematically illustrating an internal lead and a lead connecting member of FIG. 2. In addition, FIG. 4 is an exploded perspective view of FIG. 3 and FIG. 5 is a partial plan view taken along a direction B of FIG. 2. Here, in FIG. 5, a molded portion is omitted for convenience of explanation.

Referring to FIGS. 1 through 5, a semiconductor package 100 according to the present exemplary embodiment may be configured to include an electronic device 10, a lead frame 20, and a molded portion 80.

The electronic device 10 may include various devices such as passive devices, active devices, and the like. Particularly, the electronic device 10 according to the present exemplary embodiment may include at least one first electronic device 12 (e.g., a power device) and at least one second electronic device 14 (e.g., a control device).

Here, the power device 12, which is the first electronic device 12, may be a power converting device for a power control or a power circuit device for a power control such as a servo driver, an inverter, a power regulator, a converter, and the like.

For example, the power device 12 may be a power metal oxide semiconductor field effect transistor (MOSFET), a bipolar junction transistor (BJT), an insulated gate bipolar transistor (IGBT), a diode, or may include a combination thereof. That is, in the present exemplary embodiment, the power device 12 may include all or some of the above-mentioned devices.

In addition, two power devices 12 which are illustrated may be the IGBT and the diode, respectively. In addition, a total of six pairs of power device packages may be implemented, wherein each pair includes the IGBT and the diode. However, the above-mentioned structure is only an example, and the present disclosure is not necessarily limited thereto.

The power devices 12 may be attached to a die pad 22 of the lead frame 20 to be described below through an adhesive member (not shown). Here, the adhesive member may be conductive or non-conductive. For example, as the adhesive member, pastes such as a solder, a metal epoxy, a metal paste, a resin-based epoxy, and the like may be cured to be used.

The control device 14 may be electrically connected to the power device 12 through a bonding wire 90, and may control an operation of the power device 12, accordingly. The control device 14 may be, for example, a microprocessor. In addition, the control device 14 may be a passive device such as a resistor, an inverter, or a condenser, or active devices such as a transistor.

Meanwhile, one control device 14 or a plurality of control devices 14 may be disposed with respect to one power device 12. That is, the kind and the number of control devices 14 may be appropriately selected depending on the kind and the number of power devices 12.

As such, the semiconductor package 100 according to the present exemplary embodiment may be a power module including the power device 12 and the control device 14 controlling the power device 12.

In addition, in the present exemplary embodiment, the power device 12 and the control device 14 are not disposed in a shape in which they are vertically stacked, but are horizontally disposed. Accordingly, the semiconductor package 100 may be formed to have a shape having a horizontal length (i.e., width) longer than a vertical length (i.e., thickness).

The power device 12 and the control device 14 may be electrically connected to the lead frame through a bonding wire 90.

The bonding wire 90 according to the present exemplary embodiment may be formed of a metal material, for example, aluminium (Al), gold (Au), or an alloy thereof. Meanwhile, although the present exemplary embodiment illustrates a case in which the electronic devices 10 are electrically connected to the lead frame 20 through the bonding wire 90, a configuration of the present disclosure is not limited thereto.

That is, various methods may be used. For example, the electronic device 10 and the lead frame 20 may be electrically connected to each other in a flip chip bonding scheme or using a solder ball.

The lead frame 20 may be configured to include a plurality of leads, where the respective leads may be classified into a plurality of external leads 20b connected to an external substrate (e.g., mother board: not shown) and a plurality of internal leads 20a connected to the electronic device 10. That is, the external lead 20b may refer to a portion exposed to an exterior of the molded portion 80 and the internal lead 20a may refer to a portion disposed in the molded portion 80.

In addition, the lead frame 20 may include at least one die pad 22. The die pad is a region on which the electronic devices 10 are mounted. The present exemplary embodiment illustrates a case in which the die pad 22 is formed to have a down set shape which is bent to have a step from an internal lead 20a, by way of example. However, the configuration of present disclosure is not limited thereto.

In addition, the lead frame 20 according to the present exemplary embodiment may include at least one lead connecting member 30.

As shown in FIGS. 3 and 4, the lead connecting member 30 according to the present exemplary embodiment may be provided to connect at least two internal leads 20a (hereinafter, referred to as leads) to each other. In addition, the lead connecting member 30 may be provided to prevent the lead frame 20 from being separated from the molded portion 80.

The lead connecting member 30 may be coupled to at least two leads 20a to electrically connect the at least two leads 20a to each other. The lead connecting member 30 according to the present exemplary embodiment may be formed to have a ⊏ shape.

More specifically, the lead connecting member 30 may be configured to include a plurality of coupling parts 32 coupled to the leads 20a and a connecting part 35 connecting the coupling parts 32 to each other.

The coupling part 32 may penetrate through the internal lead 20a of the lead frame 20 and may be coupled to the lead frame 20. Therefore, the coupling part 32 may be formed to have a length longer than or approximately similar to a vertical thickness of the lead 20a.

In addition, the connecting part 35 may be formed to have the same thickness as that of the coupling part 32. However, the thickness of the connecting part 35 is not limited thereto, but may be formed to be thinner or thicker than that of the coupling part 32.

The lead 20a of the lead frame 20 may be provided with at least one through hole 21 into which the coupling part 32 is inserted. The through hole 21 may be formed to have a shape corresponding to a cross section of the coupling part 32 to allow the coupling part 32 to be easily inserted into the through hole 21. The present exemplary embodiment illustrates a case in which the through hole 21 corresponding to the shape of the coupling part 32 is formed to have a cylindrical shape, by way of example. However, the shape of the through hole 21 is not limited thereto. For example, the through hole 21 may be formed in various shapes such as a polygonal shape, an oval shape, and the like, if necessary.

Further, the present exemplary embodiment illustrates a case in which the through hole 21 is formed in a center of the lead 20a, by way of example. However, the through hole 21 may be variously applied. For example, the through hole 21 may be formed in a position leaned to one side rather than the center of the lead 20a, may be formed so that a portion thereof is opened through a side surface of the lead 20a, and so forth.

The above-mentioned lead connecting member 30 may be inserted into the through holes 21 formed in the leads 20a from above the leads 20a and may be coupled to the leads 20a. In addition, the lead connecting member 30 may also be coupled to the leads 20a from below the leads 20a.

Meanwhile, the present exemplary embodiment illustrates a case in which the through holes 21 are formed to have a shape in which they vertically penetrate through the leads 20a, by way of example. However, the present disclosure is not limited thereto, but may be variously applied as needed. For example, the through hole 21 may be obliquely formed.

In the semiconductor package 100 according to the present disclosure having the configuration as described above, the leads 20a spaced apart from each other by the lead connecting member 30 may be electrically connected to each other. That is, as shown in FIG. 5 when two leads 201a and 202a that need to be electrically connected to each other are disposed to be spaced apart from each other and other leads 203a are disposed between the two leads 201a and 202a, the corresponding leads 201a and 202a may be electrically connected to each other by the lead connecting member 30 with ease.

Particularly, in the case in which there is no the lead connecting member 30 according to the present exemplary embodiment, in order to connect a bonding wire 90a to a specific lead 201a in FIG. 5, the corresponding bonding wire 90a needs to be disposed to intersect a bonding wire 90b connected to another lead 203a.

However, in the case in which the lead connecting member 30 according to the present exemplary embodiment is provided, as shown in FIG. 5, the bonding wire 90a may be connected to another lead 202a, such that another lead 202a may be electrically connected to the corresponding lead 201a using the lead connecting member 30. Therefore, the bonding wires 90a and 90b are disposed to intersect each other, such that a short circuit generated between the bonding wires 90a and 90b and an increase in the entire volume of the package may be prevented.

In addition, the lead connecting member 30 according to the present exemplary embodiment may be coupled to the lead 20a in a shape in which a portion of the lead connecting member 30 protrudes from the leads 20a to the outside. Therefore, the lead connecting member 30 may also serve as a protrusion protruded from the lead 20a.

The above-mentioned protruded portion serves as the protrusion in the molded portion 80, whereby it may suppress the leads 20a buried in the molded portion 80 from being separated from the molded portion 80. Therefore, the lead connecting member 30 may also provide a function preventing the lead 20a from being separated from the molded portion 80.

Meanwhile, the semiconductor package according to the present exemplary embodiment is not limited to the above-mentioned embodiment, but may be variously applied.

Figure 6:
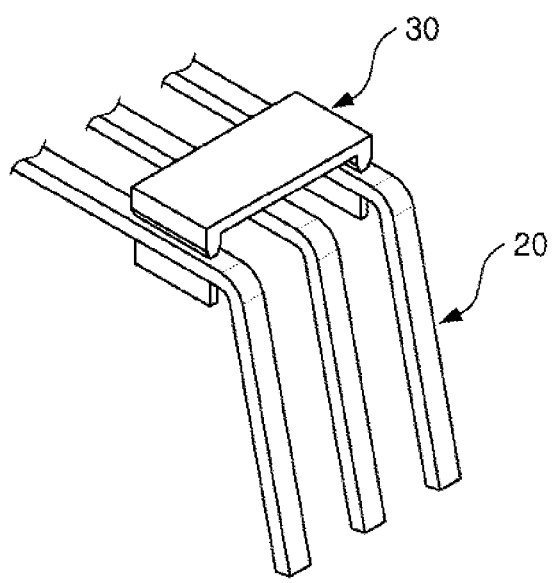
FIG. 6 is a perspective view schematically illustrating a lead connecting member and a lead frame according to another exemplary embodiment in the present disclosure.
Figure 7:
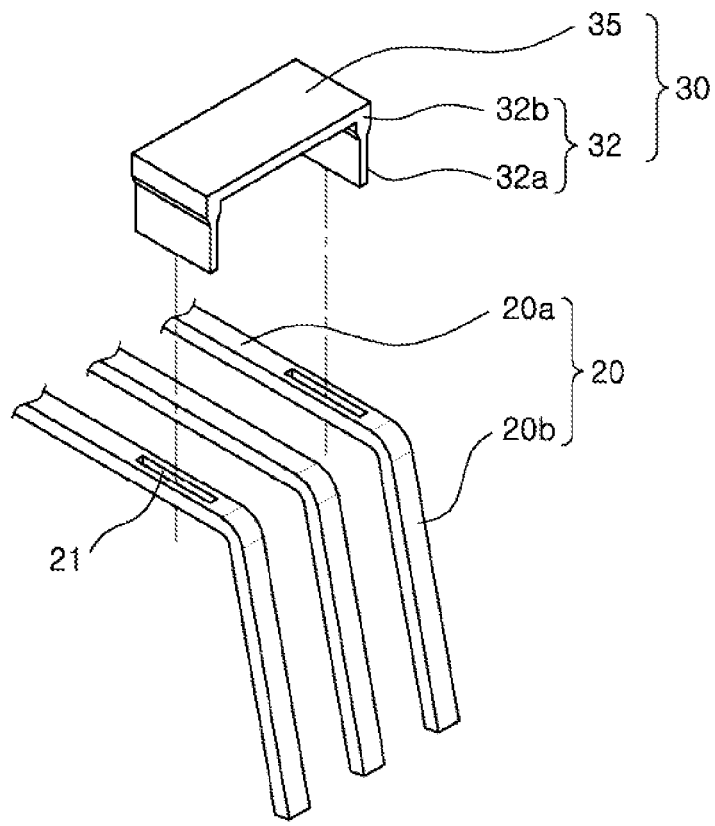
FIG. 7 is an exploded perspective view of FIG. 6.

FIG. 6 is a perspective view schematically illustrating a lead connecting member and a lead frame according to another exemplary embodiment in the present disclosure and FIG. 7 is an exploded perspective view of FIG. 6.

Referring to FIGS. 6 and 7, the coupling part 32 of the lead connecting member 30 according to the present exemplary embodiment may include an insertion part 32a inserted into the through hole 21 of the lead 20a and an extension part 32b disposed outside the through hole 21.

The insertion part 32a and the extension part 32b may have different cross sectional areas. Specifically, the extension part 32b may be formed to have a shape having an extended cross sectional area as compared to the insertion part 32a. In addition, the through hole 21 may be formed to have a size and a shape corresponding to a cross sectional area of the insertion part 32a.

Accordingly, when the lead connecting member 30 is coupled to the lead 20a, as shown in FIG. 7, the lead connecting member 30 is coupled to the lead 20a in a shape in which only the insertion part 32a is inserted into the through hole 21 and the extension part 32b is caught in an entrance of the through hole 21.

As such, in the case in which the coupling part 32 has the extension part 32b, it may easily space an interval between the connecting part 35 of the lead connecting member 30 and the leads 20a. Therefore, a contact occurrence between the connecting part 35 and other leads 20a may be prevented.

The lead connecting member 30 according to the present exemplary embodiment may have the insertion part 32a formed to have a plate shape. Therefore, the through hole 21 may be formed to have a slit shape so that the insertion part 32a having the plate shape may be inserted into the through hole 21.

In this case, since a width of through hole 21 formed in the lead 20a may be significantly decreased, a width of the lead 20a may also be significantly decreased.

Figure 8:
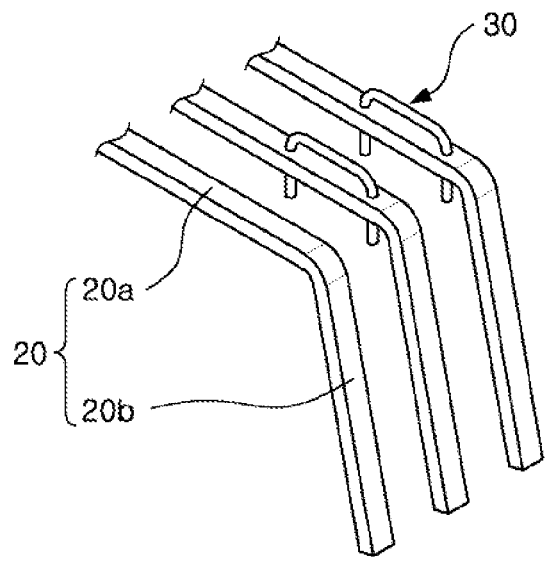
FIG. 8 is a perspective view schematically illustrating a lead connecting member and a lead frame according to another exemplary embodiment in the present disclosure.
Figure 9:
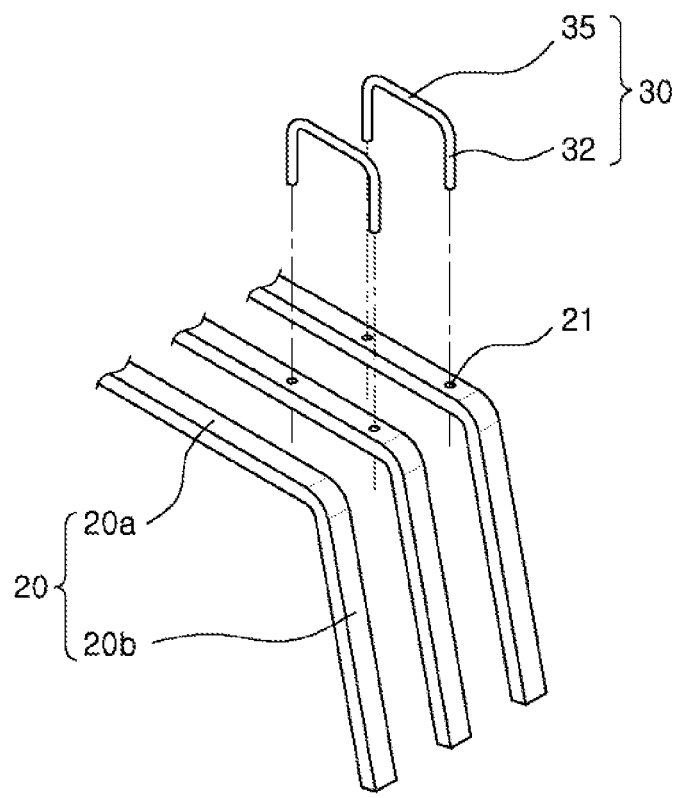
FIG. 9 is an exploded perspective view of FIG. 8.

FIG. 8 is a perspective view schematically illustrating a lead connecting member and a lead frame according to another exemplary embodiment in the present disclosure and FIG. 9 is an exploded perspective view of FIG. 8.

Referring to FIGS. 8 and 9, the lead connecting member 30 according to the present exemplary embodiment may be coupled to one lead 20a.

Here, one lead 20a may be provided with a plurality of through holes 21 to which the coupling part 32 of the lead connecting member 30 is connected. According the present exemplary embodiment, the lead connecting member 30 may have the same configuration as those of the above-mentioned lead connecting members 30.

As such, in the case in which one lead connecting member 30 is coupled to only one lead 20a, the leads 20a may not perform a function that electrically connects the leads 20a to each other, but may suppress the lead 20a from being separated from the molded portion by the lead connecting member 30.

That is, the present exemplary embodiment may be used to prevent the leads 20a from being separated from the molded portion in the semiconductor package 100 in which the leads 20a need not to be electrically connected to each other.

In this case, a material of the lead connecting member 30 needs not to be limited to a conductive material. That is, the lead connecting member 30 may be formed of an insulating material such as a resin.

Figure 10:
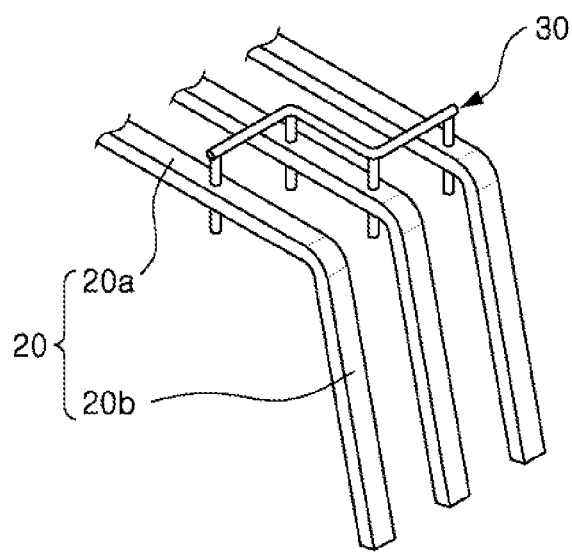
FIG. 10 is a perspective view schematically illustrating a lead connecting member and a lead frame according to another exemplary embodiment in the present disclosure.
Figure 11:
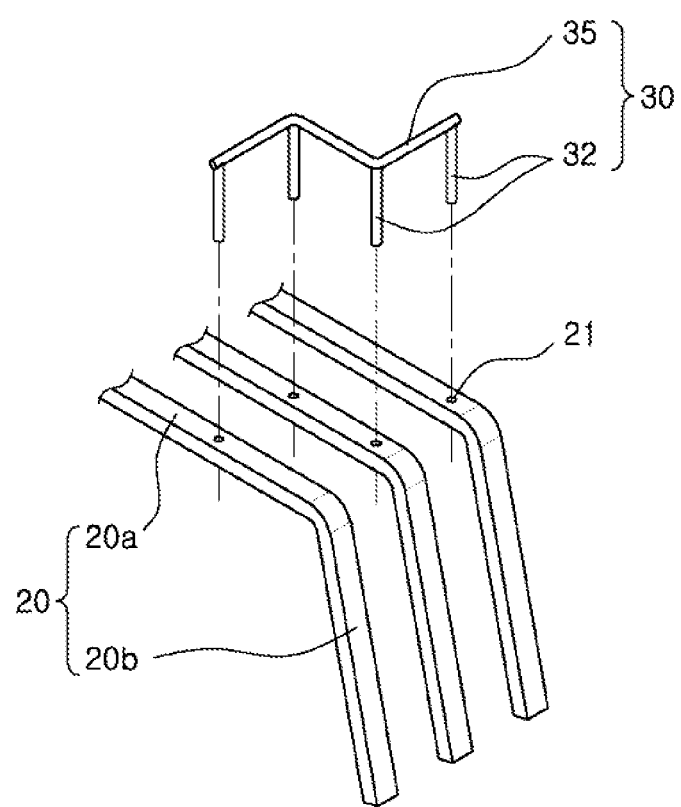
FIG. 11 is an exploded perspective view of FIG. 10.

FIG. 10 is a perspective view schematically illustrating a lead connecting member and a lead frame according to another exemplary embodiment in the present disclosure and FIG. 11 is an exploded perspective view of FIG. 10.

Referring to FIGS. 10 and 11, the lead connecting member 30 according to the present exemplary embodiment may include four coupling parts 32.

As such, in the case in which the lead connecting member 30 has a plurality of coupling parts 32, the lead connecting member 30 may electrically connect three or more leads 20a at one time.

In addition, in this case, the plurality of coupling parts 32 may be coupled to one lead 20a or may be coupled to other leads 20a, respectively. However, a configuration of the present disclosure is not limited thereto, but may be variously deformed as needed.

As set forth above, according to exemplary embodiments of the present disclosure, in the semiconductor package, the leads spaced apart from each other may be electrically connected to each other by the lead connecting member. That is, when two leads that need to be electrically connected to each other are disposed to be spaced apart from each other and other leads are disposed between the two leads, the corresponding leads may be electrically connected to each other by the lead connecting member with ease.

In addition, the lead connecting member according to an exemplary embodiment in the present disclosure may be coupled to the lead in a shape in which at least portion of the lead connecting member protrudes from the leads to the outside. Therefore, the lead connecting member may also serve as the protrusion protruded from the lead.

The above-mentioned protruded portion serves as the protrusion in the molded portion, whereby it may suppress the leads buried in the molded portion from being separated from the molded portion. Therefore, the lead connecting member may have a function preventing the lead from being separated from the molded portion.

While exemplary embodiments have been shown and described above, it will be apparent to those skilled in the art that modifications and variations could be made without departing from the scope of the present invention as defined by the appended claims.

What is claimed is:

1. A semiconductor package comprising:
at least one electronic device;
a lead frame including a plurality of leads electrically connected to the electronic device;
a lead connecting member coupled to at least one of the leads; and
a molded portion sealing the electronic device and the lead connecting member,
wherein the leads include at least one through hole to which the lead connecting member is coupled.

2. The semiconductor package of claim 1, wherein the lead connecting member is formed to have a ⊏ shape.

3. The semiconductor package of claim 1, wherein the lead connecting member includes:
a plurality of coupling parts coupled to the leads; and
a connecting part connecting the plurality of coupling parts to each other.

4. The semiconductor package of claim 3, wherein the coupling part of the lead connecting member includes:
an insertion part inserted into a through hole formed in the lead; and
an extension part disposed outside the through hole and having cross sectional area larger than that of the insertion part.

5. The semiconductor package of claim 1, wherein one lead connecting member is coupled to one lead.

6. The semiconductor package of claim 1, wherein the lead connecting member is coupled to the plurality of leads.

7. The semiconductor package of claim 1, wherein the lead connecting member is formed of a conductive metal material.

8. The semiconductor package of claim 1, wherein the through hole is formed to have a cylindrical shape.

9. The semiconductor package of claim 1, wherein the through hole is formed to have a slit shape.

10. The semiconductor package of claim 1, wherein the lead frame includes an internal lead disposed in the molded portion and an external lead disposed outside the molded portion, and
the lead connecting member is coupled to the internal lead.

11. A semiconductor package comprising:
a lead frame including a plurality of leads electrically connected to an electronic device;
a lead connecting member coupled to at least one of the leads to form a protrusion of the lead; and
a molded portion sealing the electronic device and the lead connecting member,
wherein the leads include at least one through hole to which the lead connecting member is coupled.

12. A semiconductor package comprising:
a lead frame including a plurality of leads electrically connected to an electronic device;
a lead connecting member coupled to the plurality of leads to electrically connect the leads to each other; and
a molded portion sealing the electronic device and the lead connecting member,
wherein the leads include at least one through hole to which the lead connecting member is coupled.

* * * * *